United States Patent
Bange et al.

(10) Patent No.: US 10,382,029 B2
(45) Date of Patent: Aug. 13, 2019

(54) SAFE CONTROL OF A CONSUMER

(71) Applicant: ZF Friedrichshafen AG, Friedrichshafen (DE)

(72) Inventors: Paul Bange, Regenstauf (DE); Thomas Maier, Neunburg v. Wald (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 15/774,872

(22) PCT Filed: Nov. 10, 2016

(86) PCT No.: PCT/EP2016/077303
§ 371 (c)(1),
(2) Date: May 9, 2018

(87) PCT Pub. No.: WO2017/084962
PCT Pub. Date: May 26, 2017

(65) Prior Publication Data
US 2018/0323776 A1    Nov. 8, 2018

(30) Foreign Application Priority Data
Nov. 20, 2015 (DE) ........................ 10 2015 222 990

(51) Int. Cl.
*H03K 17/0812* (2006.01)
*G01R 31/02* (2006.01)
(Continued)

(52) U.S. Cl.
CPC ..... *H03K 17/08122* (2013.01); *G01R 31/025* (2013.01); *G01R 31/3277* (2013.01);
(Continued)

(58) Field of Classification Search
CPC ...... G01R 31/00; G01R 31/025; H03K 17/00; H03K 17/04123; H03K 17/063;
(Continued)

(56) References Cited

U.S. PATENT DOCUMENTS 5,086,364 A    2/1992 Leipold
7,187,091 B2    3/2007 Veil
(Continued)

FOREIGN PATENT DOCUMENTS

DE        101 27 233 C1    11/2002
DE    10 2010 013 322 A1   10/2011
(Continued)

OTHER PUBLICATIONS

German Office Action in priority application DE 10 2015 222 990.4 dated Jul. 13, 2016, in German language, 11 pages (including English translation of p. 9).
(Continued)

*Primary Examiner* — Lincoln D Donovan
*Assistant Examiner* — Dave Mattison
(74) *Attorney, Agent, or Firm* — Brinks Gilson & Lione

(57) ABSTRACT

The disclosure relates to a control device for controlling a load, wherein the control device comprises the following elements: a first current control valve between a first port of the load and a first potential of an operating voltage; a second current control valve between a second port of the load and a second potential of the operating voltage; a processor configured to actuate the second current control valve when the first current control valve is closed, in order to control a current through the load; and a sampling device for determining an input voltage through the first current control valve, wherein the processor is configured to determine the presence of a short circuit between the first port and the first potential if the input voltage does not increase when the first current control valve is opened gradually.

19 Claims, 3 Drawing Sheets

(51) Int. Cl.
| | |
|---|---|
| H01F 7/06 | (2006.01) |
| H01F 7/18 | (2006.01) |
| H03K 17/082 | (2006.01) |
| G01R 31/327 | (2006.01) |
| F16H 61/12 | (2010.01) |
| G01R 31/28 | (2006.01) |

(52) U.S. Cl.
CPC ........... *H01F 7/064* (2013.01); *H01F 7/1844* (2013.01); *H03K 17/0822* (2013.01); *F16H 2061/1268* (2013.01); *G01R 31/2829* (2013.01); *H03K 2217/0027* (2013.01)

(58) Field of Classification Search
CPC ........... H03K 17/08122; H03K 17/168; H03K 17/687; H03K 17/6874; H03K 2217/00; H03K 2217/0027
USPC ........................................................ 327/434
See application file for complete search history.

(56) References Cited

U.S. PATENT DOCUMENTS

| | | |
|---|---|---|
| 9,366,717 B2 | 6/2016 | Rätz |
| 9,419,523 B2 | 8/2016 | Wolfarth |
| 9,519,012 B2 | 12/2016 | Niederberger |
| 2013/0076369 A1* | 3/2013 | Niederberger ..... H03K 17/0822 324/537 |
| 2015/0102790 A1* | 4/2015 | Wolfarth ............... H02M 3/158 323/271 |
| 2015/0137828 A1* | 5/2015 | Schmauss ............ G01R 31/026 324/551 |
| 2015/0168484 A1* | 6/2015 | Ratz .................. G01R 31/2608 327/109 |

FOREIGN PATENT DOCUMENTS

| | | |
|---|---|---|
| DE | 10 2012 203 939 A1 | 9/2013 |
| DE | 10 2014 202 460 B3 | 2/2015 |
| EP | 0 352 659 A2 | 1/1990 |
| EP | 2 884 662 A1 | 6/2015 |

OTHER PUBLICATIONS

International Search Report dated Feb. 16, 2017 in International Application No. PCT/EP2016/077303, 3 pages, English Language.
International Search Report dated Feb. 16, 2017 in International Application No. PCT/EP2016/077303, 4 pages, German Language.
Written Opinion of the International Search Authority dated May 26, 2017 in International Application No. PCT/EP2016/077303, 8 pages, German Language.

* cited by examiner

SAFE CONTROL OF A CONSUMER

This application is a filing under 35 U.S.C. § 371 of International Patent Application PCT/EP2016/077303, filed Nov. 10, 2016, and claims the priority of DE 10 2015 222 990.4, filed Nov. 20, 2015. These applications are incorporated by reference herein in their entirety.

The disclosure relates to the safe control of a load. In particular, the disclosure relates to a load control that has a diagnostics function.

A motor vehicle comprises a transmission that can be controlled by an electric control device by means of actuators. The actuators can comprise electromechanical valves that act directly or by means of a hydraulic element on the transmission. In order to maintain the safety of the motor vehicle, the actuators must be activated such that even if a component fails, at least a safe operating state is ensured.

A control device for the electrical activation of a load such as the actuator normally comprises two current control valves that are interconnected in different supply lines between the load and an operating voltage. One of the current control valves normally remains fully closed, and the other is used for controlling the current flow through the load. For this, the second current control valve is periodically opened and closed by means of a pulse-width modulated (PWM) signal. If the load cannot be switched off by means of the second current control valve, e.g. because the second current control valve is defective, or the second current control valve is short circuited, the first current control valve can still be opened, in order to shut off the load.

In order to determine if the first current control valve is short circuited, a current flowing through the load can be observed while the second current control valve is closed and the first current control valve is open. If a current continues to flow, the opening of the first current control valve had no effect, and the first current control valve was short circuited. If it is not short circuited, however, when both current control valves are opened, the load is shut off. In the course of a control task that is affected by the load, this is often undesirable, such that the short circuit in the first current control valve can only be determined in a special operating state, e.g. when starting up the control device.

The fundamental object of the disclosure is to provide a better technology for better diagnosis of a short circuit in the first current control valve. This problem is solved by means of a device and a method that have the features of the independent claims. The dependent claims describe preferred embodiments.

A control device for controlling a load comprises a first current control valve between a first port of the load and a first potential of an operating voltage, a second current control valve between a second port of the load and a second potential of the operating voltage, a processor configured to actuate the second current control valve when the first current control valve is closed, in order to control a current through the load, and a sampling device for determining an input voltage through the first current control valve. The processor is configured to determine the presence of a short circuit between the first port and the first potential if the input voltage does not increase when the first current control valve is gradually opened.

It is possible to open the first current control valve just far enough on this control device that when functioning correctly, the input voltage through the first current control valve increases sufficiently. The load remains on thereby, and the voltage applied thereto is only reduced by the amount that passes across the first current control valve, e.g. up to about IV. A current flow through the load can be controlled by means of the second current control valve, e.g. by periodically opening and closing the second current control valve at a specific rate. The short circuit in the first current control valve may be in the area of the load, in the area of a supply line, in the area of the current control valve, or even in the current control valve itself, if it malfunctions.

Advantageously, a short circuit between the first port and the first potential, thus a short circuit in the first current control valve, can also be detected during operation of a control unit in which the load acts as an actuator. Although the short circuit in the first current control valve does not result alone in a critical state of the load, when combined with a second malfunction, this may result in a critical state. An emergency shut down of the load by means of the first current control valve is then no longer possible, and is thus referred to as a latent or sleeping malfunction.

The processor is preferably configured to determine the presence of a short circuit between the first port and the second potential if the input voltage exceeds a predetermined threshold value. The sampling device for determining the input voltage through the first current control valve can already be provided for determining the presence of a short circuit to the second potential. If the input voltage exceeds a predetermined threshold value, which can lie in a range of 0.1 to 1.0 volts, depending on the configuration, it then indicates an excessive current, and it can be assumed that there is a short circuit between the first port of the load and the second potential of the operating voltage. In one embodiment, the sampling device can comprise a comparator, which then emits a signal when the input voltage exceeds the predetermined threshold value. This circuit can also be used to determine a sufficient voltage across the first current control valve when the first current control valve is closed gradually.

An assignment of the two current control valves to a polarity of the operating voltage can be arbitrary. In a first variation, the first potential comprises a high potential, and the second potential comprises a low potential, wherein a short circuit in the load can be determined in comparison with the operating voltage. The first current control valve is normally referred to as a high-side switch, and the second current control valve is normally referred to as a low-side switch. In a second variation, the first potential comprises a low potential, and the second potential comprises a high potential, wherein a short circuit in the load can be determined in comparison with the ground. In this case, the first current control valve is referred to as a low-side switch, and the second current control valve is referred to as a high-side switch. In other words, the first current control valve, serving as the emergency shut down, and the second current control valve, which controls the current through the load, can be arbitrarily assigned to an assembly as a high-side switch and a low-side switch. The second current control valve can be configured as either a high-side switch or a low-side switch independently thereof, wherein it is preferred that the current control valves are connected to the load with different ports, and not both provided as the high-side switch or the low-side switch.

It is particularly preferred that the first current control valve comprises an N-channel field effect transistor, and the gradual closing comprises a decrease in a gate-source voltage. If the gate-source voltage at the N-channel field effect transistor is sufficiently high, the path between the source and the drain is a low impedance path, such that the first current control valve is closed. If the gate-source voltage is decreased, the field effect transistor approaches an operating point at which the resistance between the source and the drain increases. By altering the gate-source voltage, the functionality of the first current control valve can be checked without fully opening the first current control valve. In another embodiment, the first current control valve can also comprise a P-channel field effect transistor, wherein the gradual opening thereof comprises an increase in the gate-source voltage. Other types of transistors can also be used in a corresponding manner, e.g. a bipolar transistor.

An integrated current control valve for controlling a load comprises a semiconductor switch for controlling a current between a potential of an operating voltage and a port of the load; a comparator for comparing an input voltage across the semiconductor switch with a predetermined value; and a control device for the semiconductor switch. The control device is configured to gradually alter a control voltage of the conducting semiconductor switch toward a non-conducting state, and to generate a warning signal, if the comparator does not determine that there is sufficient voltage thereby. The integrated current control valve can integrate parts of the control device described above with one another, and be used for controlling the load, in order to obtain a redundant emergency shut down in conjunction with the second current control valve. The integrated current control valve is preferably configured as an integrated circuit (IC). The structure of circuits that are critical for safety can be simplified or improved with the integrated current control valve. The second current control valve can be constructed in a similar manner, with an integrated control circuit, wherein the comparator and the gradual altering of the control voltage do not need to be implemented therein.

A method for controlling a load with two ports, wherein the first port is connected to a first potential of an operating voltage by means of a first current control valve, and the second port is connected to a second potential of the operating voltage by means of a second current control valve, comprises steps for the gradual opening of the first current control valve when the second current control valve is actuated, and the determination of the presence of a short circuit between the first port and the first potential, if an input voltage across the first current control valve does not increase when the first current control valve is opened gradually. The method can be carried out in particular by means of the control device described above.

It is generally preferred that the second current control valve is actuated through periodic opening and closing thereof. The open and closed periods can be controlled in particular by means of a pulse-width modulated signal, the sampling rate of which is selected in accordance with a current that is to flow through the load.

The disclosure shall now be described in greater detail in reference to the attached drawings, in which.

Figure 1:
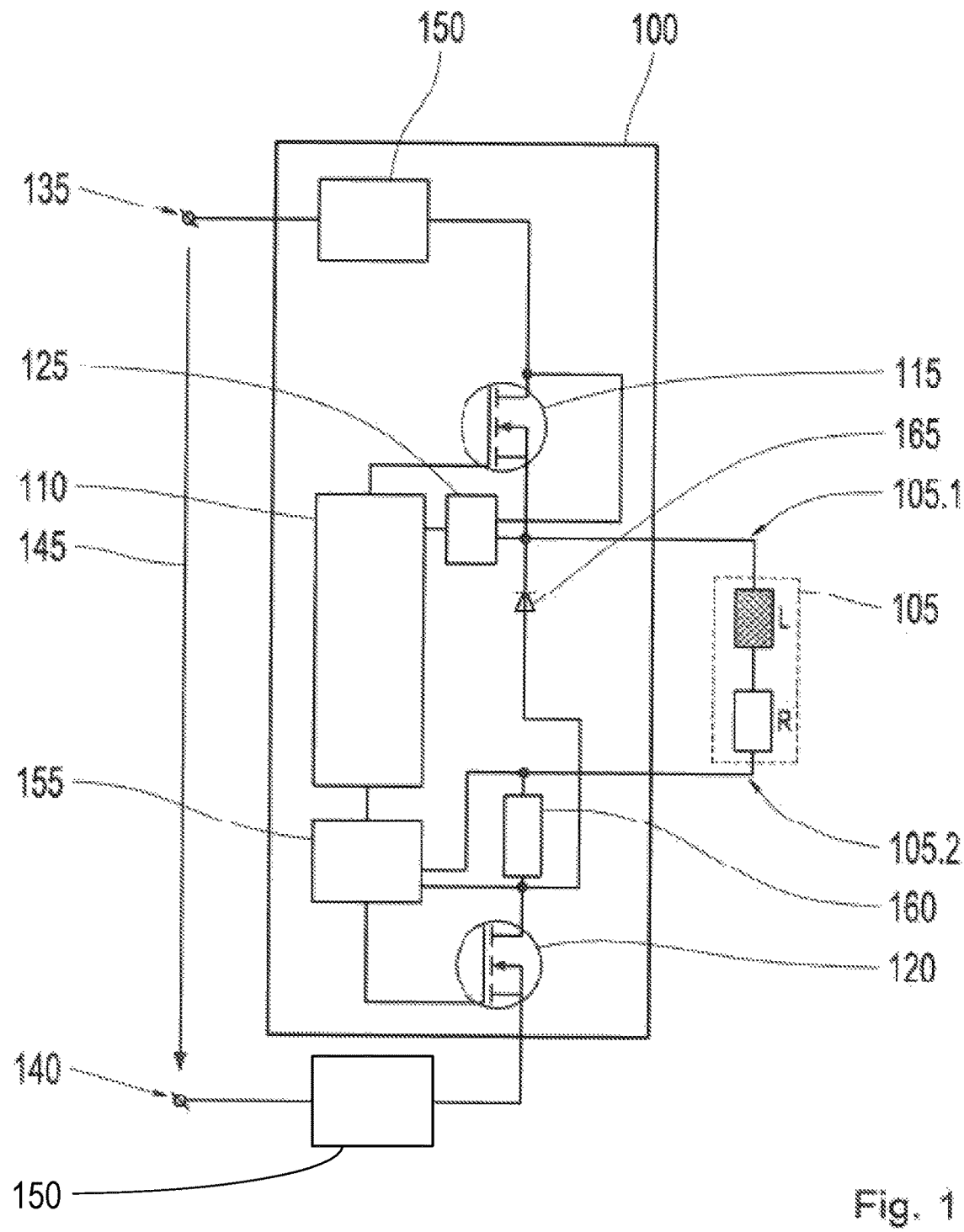
FIG. 1 shows a circuit diagram of a control device for controlling a load.

FIG. 1 shows a circuit diagram of a control device 100 for controlling a load 105 that has a first port 105.1 and a second port 105.2. The load 105 preferably comprises a load that has an inductive component L and an ohmic component R, in particular a coil. The load 105 can comprise an electrically actuated hydraulic valve in a preferred embodiment, which is configured in particular for controlling a transmission, e.g. in a drive train of a motor vehicle.

The control device 100 comprises a processor 110, a first current control valve 115, a second current control valve 120, and a sampling device 125. In a first variation, a first current control valve 115 and numerous loads 105 are provided, the second ports of which can be activated by means of respective dedicated second current control valves 120. By way of example, up to 10 or more loads 105 can be safeguarded by means of just one first current control valve 115. For purposes of clarity, it is assumed that there is only one load 105 and one second current control valve 120 in the following explanation.

An operating voltage 145 has a first potential 135 and a second potential 140. In the present example, it is assumed that the first potential 135 is a high potential and the second potential 140 is a low potential. The first current control valve 115 is interconnected between the first potential 135 and the first port 105.1 of the load 105, while the second current control valve 120 is interconnected between the second port 105.2 of the load 105 and the second potential 140. Optionally, an inverse-polarity protection 150 can also be provided between the first potential 135 and the first current control valve 115. Alternatively, the inverse-polarity protection 150 can also be disposed between the second current control valve 120 and the second potential 140.

The first current control valve 115 can be controlled directly by the processor 110. The second current control valve 120 can be controlled in the same manner, or by means of a pulse-width modulator 155, which can be controlled in particular by the processor 110. By selecting an appropriate rate for the pulse-width modulator 155, the second current control valve 120 can be switched on and off such that when the first current control valve 115 is closed, a predetermined current through the load 105 is obtained.

Optionally, a series resistor (shunt) 160 is provided, lying in the current flow through the load 105. The position of the series resistor 160 can be selected arbitrarily; in the present embodiment, the series resistor 160 is located between the second port 105.2 of the load 105 and the second current control valve 120. In order to protect against voltage surges, a diode 165 can also be provided as a freewheel, which is connected in parallel to the load 105, counter to the direction of flow from the first potential 135 to the second potential 140. The input voltage through the series resistor 160 can be sampled in order to determine a current flowing through the load 105. The pulse-width modulator 155 can be controlled in relation to this current.

When the load 105 is in operation, the first current control valve 115 is closed and the second current control valve 120 is actuated such that the current flowing through the load 105 corresponds to a first predetermined value. For this, the second current control valve 120 can be opened and closed, in particular in a predetermined pulse-width modulation (PMW), such that a predetermined voltage is established at the load 105. This activation is particularly suitable when the load 105 comprises an inductive or capacitive load.

If the load 105 cannot be shut off by means of the second current control valve 120, the first current control valve 115 is opened. Additional safety functions can be installed on the control device 100. In particular, it can be determined whether the input voltage in the first current control valve 115 determined by the sampling device 125 exceeds a predetermined threshold value. This can be triggered when the first port 105.1 or the second port 105.2 of the load 105 is short circuited with the second potential 140 of the operating voltage 145.

It is proposed that the functionality of the first current control valve 115 be checked as an additional safety measure, in that the first current control valve 115 is gradually opened while the second current control valve 120 is actuated, until the input voltage in the first current control valve 115 reaches a predetermined threshold value—the aforementioned threshold value in one embodiment. The gradual opening preferably takes place little by little, either in a stepless manner (analog) or in discrete steps (digital). In another embodiment, the first current control valve 115 can also be partially opened immediately, if a control voltage necessary for this is known, for example. If the threshold value is not reached by the input voltage, opening the first current control valve 115 has no effect on the current flowing through the load 105, and the presence of a short circuit between the first port 105.1 of the load 105 and the first potential 135 of the operating voltage 145 can be determined. This approach can be used independently of whether the first current control valve 115 forms a high-side switch or a low-side switch. In both cases, the second current control valve 120 can form a high-side switch or a low-side switch. The determination of the presence of a short circuit in the first current control valve 115 shall be explained in greater detail in reference to FIG. 2.

Figure 2:
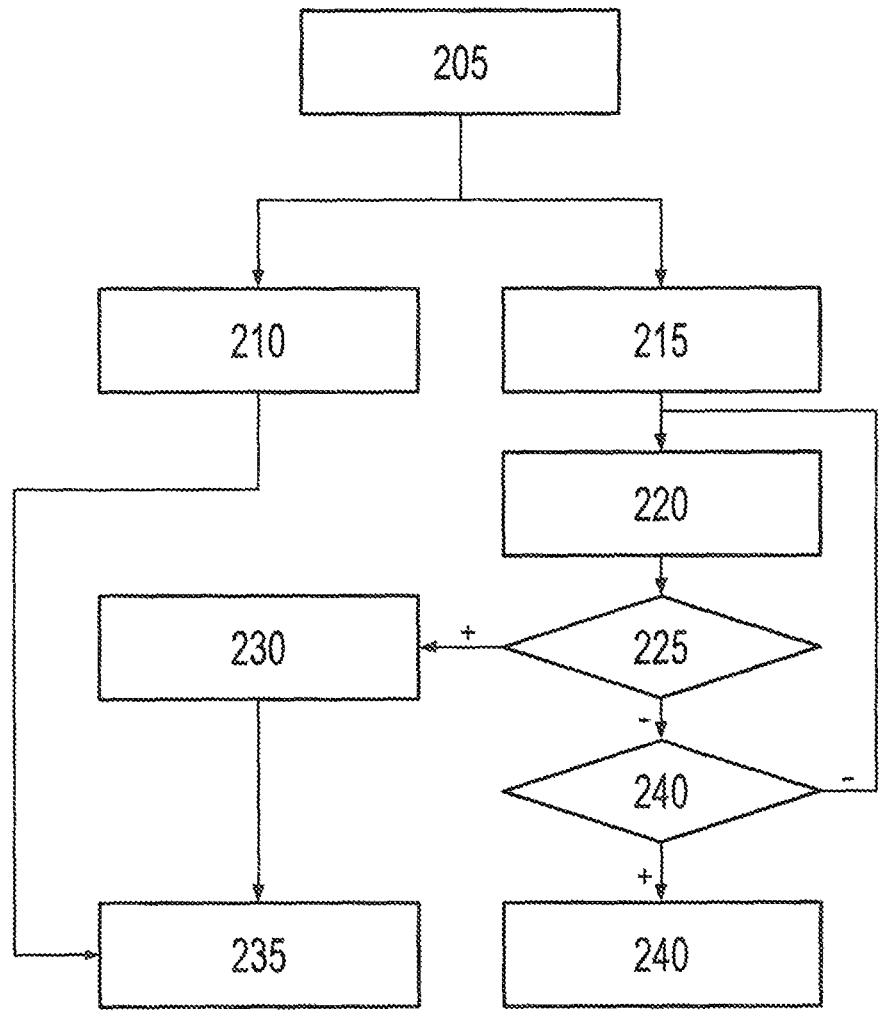
FIG. 2 shows a flow chart for a method for determining the presence of a short circuit in the control device shown in FIG. 1.

FIG. 2 shows a flow chart of a method 200 for determining the presence of a short circuit in the control device 100 shown in FIG. 1. The method 200 is designed in particular to run on the processor 110. In different embodiments, the method 200 can be initiated periodically, i.e. in a timed manner, or in an event-triggered manner, e.g. whenever the current flowing through the load 105 exceeds a predetermined minimum value.

The method 200 begins at step 205. In step 210 the second current control valve 120 is actuated, such that a current flows through the load 105. The step 210 can also serve as a boundary condition for the method 200, and need not be carried out in the framework of the method 200.

The first current control valve 115 is closed in step 215. This step can also be regarded as a prerequisite for executing the process 200. In a following step 220, the first current control valve 115 is gradually opened. The first current control valve 115 preferably comprises a transistor, which can be brought into a conducting or non-conducting state by means of a control voltage. The gradual closing of the first current control valve 115 in this case comprises a change in the control voltage from a first value, corresponding to a conducting state, to a second value, corresponding to a non-conducting state. In one embodiment, a control voltage is known, at which the first current control valve 115 is only partially closed such that a voltage that can be determined passes through the first current control valve 115, and this control voltage is set directly in the first current control valve 115. In another embodiment, the control voltage is successively altered toward the non-conducting state. This embodiment is the basis for the flow chart in FIG. 2.

It is checked in step 225 whether the input voltage through the first current control valve 115 reaches or exceeds a predetermined threshold value. If the sampling device 125 comprises a comparator, an interruption can be triggered in the processor if this is the case. If the threshold value is reached, this means that the first current control valve 115 can be used to interrupt the current flowing through the load 105. The first current control valve 115 is closed as quickly as possible in step 230, so that it does not disrupt the flow of current through the load 105. The method 200 ends in step 235.

If, however, a sufficient input voltage through the first current control valve 115 is not determined in step 225, it is checked in step 240 whether the first current control valve 115 is already sufficiently open. The control voltage at the first current control valve 115 can be compared with a predetermined value for this, for example. If the first current control valve 115 is not yet sufficiently open, the method 200 preferably returns to step 220, and can be repeated. If the first current control valve 115 is already open sufficiently, however, to be able to draw a safe conclusion, then the presence of a short circuit is determined between the first port 105.1 of the load 105 and the first potential 135 of the operating voltage in step 245. A corresponding notification can be provided. The load 105, moreover, is then preferably brought into a safe state in that it is shut off by means of the second current control valve 120. A corresponding pulse-width modulated signal for activating the second current control valve 120 can have a timing of 0% or 100%, such that the second current control valve 120 is fully closed to the greatest extent possible.

Figure 3:
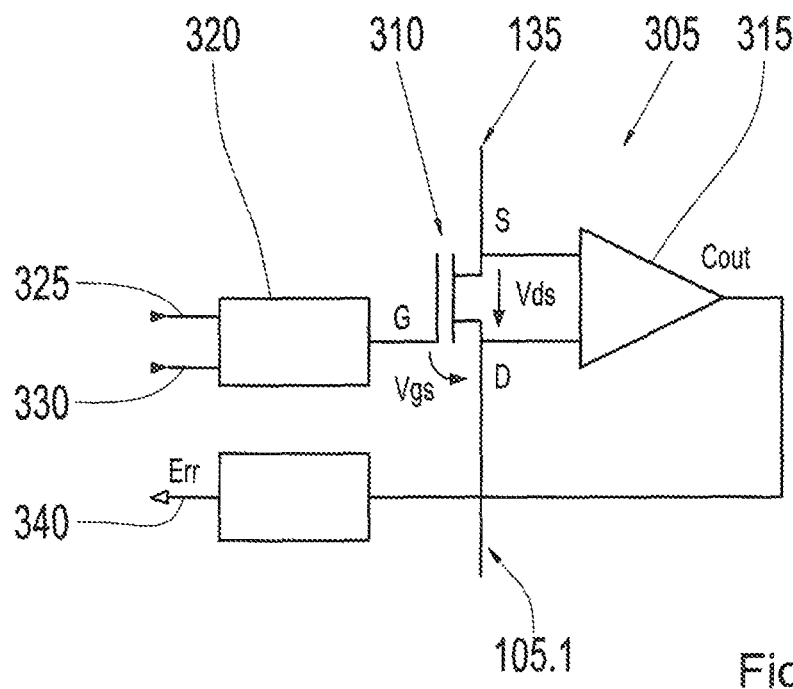
FIG. 3 shows an integrated current control valve for controlling a load.

FIG. 3 shows an integrated current control valve 305 for controlling a load 105. The integrated current control valve 305 can be used in particular as the first current control valve 115 in the control device 100 shown in FIG. 1. The integrated current control valve 305 comprises a semiconductor switch 310, formed in the illustration in FIG. 1 by one of the current control valves 115, 120, a comparator 315, an activation device 320, and a signaling unit 325. In another preferred embodiment, the integrated current control valve 305 also comprises the inverse-polarity protection 150 in FIG. 1. The integrated current control valve 305 can comprise a dedicated integrated circuit. In one embodiment, all of the elements except for the semiconductor switch 310 are comprised in the processor 110, which can be formed as a system basis chip.

The semiconductor switch 310 preferably comprises a MOSFET with three ports, called the gate (G), drain (D), and source (S). Other types of switches are also possible, e.g. IGBT. A current between the source and the drain can be controlled by means of a control voltage Ugs, applied between the source and gate. The activation device 320 is configured, depending on a signal at a first control input 330, to alternately alter the control voltage Ugs between S and D to a conducting state or a non-conducting state of the semiconductor switch 310, such that the current is allowed to flow through, or prevented from flowing through, the load 105.

The comparator 315 compares an input voltage Uds across the semiconductor switch 310, which is proportional to a current flowing through the semiconductor switch 310 and a predetermined electrical resistance between the source and drain, with a predetermined value. The resistance is known for a conducting state of the semiconductor switch 310, and the value is preferably predetermined such that when the input voltage exceeds it, this corresponds to an exceeding of a maximum permissible current through the semiconductor switch 310 when the semiconductor switch 310 is in the conducting state. In this case, a corresponding signal can be output by the signaling unit 325 via an output 335. Parallel thereto, the control voltage Ugs can be altered such that the current is limited or switched off.

The activation device 320 can be activated by means of a signal at a second control input 335 to alter the control voltage Ugs to a certain extent toward the non-conducting state. The altering preferably takes place gradually, as described above in reference to FIG. 2, and only to the extent that the current flowing through the semiconductor switch 310 is not shut off. As a result of the gradual (partial) opening of the semiconductor switch 310, the electrical resistance between the source and drain increases if a current is flowing through the semiconductor switch 310. The increase in the input voltage is detected by the comparator 315. In this operating mode, an error signal is then generated by the signaling unit 325 when the input voltage does not increase above the predetermined value. This indicates a short circuit in the semiconductor switch 310, thus between the source and the drain. In the case of an error, the current flowing through the semiconductor switch 310 can be limited or shut off.

Figure 4:
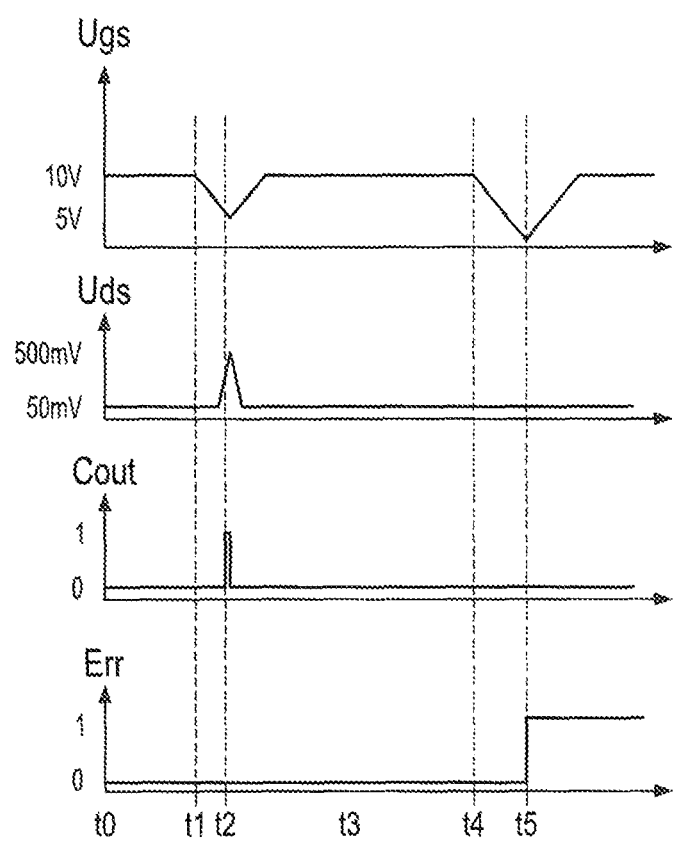
FIG. 4 shows temporal curves of the voltage present at the control device shown in FIG. 1 when carrying out the method shown in FIG. 2.

These voltage curves shall be described once again with reference to FIG. 4. Time is plotted along the horizontal axis, and voltages, or logical signals to the respective indicated components of the integrated current control valve 305 are plotted along the vertical axis. The given voltages and the positive logic used therein ("1" corresponds to active, "0" to inactive) are exemplary.

At a point in time t0, the semiconductor switch 310 is switched in response to a signal at the first control input 330. The control voltage Ugs is high, the input voltage Uds across the semiconductor switch 310 is low, the comparator 315 does not detect any exceeding of the predetermined value, and there is no error signal.

Between a point in time t1 and a point in time t2, the control voltage Ugs is decreased linearly, until the input voltage Uds exceeds the predetermined value, and the output of the comparator 315 is active. This indicates that the semiconductor switch 310 can be used to shut off the current flowing through it—and through the load 105—in that the control voltage Ugs is altered further toward the non-conducting state, thus further decreased in the present example. The decrease in the control voltage Ugs is preferably interrupted by the signal from the comparator 31, and reversed as quickly as possible, such that as little power as possible is converted to heat at the semiconductor switch 310.

At a point in time t3, the first port 135 of the operating voltage 145 and the first port 105.1 of the load 105 are short circuited to one another. The electrical resistance of the short circuit is normally lower than that between the source and the drain of the semiconductor switch 310 when it is in the conducting state.

At a point in time t4, the same process started at point in time t1 is started, but the control voltage Ugs reaches a predetermined low value without the comparator 315 signaling an input voltage at the semiconductor switch 310 that exceeds the predetermined value. This indicates that the semiconductor switch 310 is not available for interrupting the current flowing through the load 105 due to a short circuit. This error is indicated by a signal output at the output 340. The current control valve 120 then shuts it off.

REFERENCE SYMBOLS

100 Control device
105 Load
105.1 First port
105.2 Second port
110 Processor
115 First current control valve
120 Second current control valve
125 Sampling device
135 First potential
140 Second potential
145 Operating voltage
150 Inverse-polarity protection
155 Pulse width modulator
160 Series resistor (shunt)
165 Diode
200 Method
205 Start
210 Second current control valve actuated
215 First current control valve closed
220 First current control valve opened further
225 Voltage surge alarm?
230 First current control valve sufficiently open?
235 End
240 First current control valve fully opened
245 Determination of a short circuit
305 Integrated current control valve
310 Semiconductor switch
315 Comparator
320 Activation device
325 Signaling unit
330 First control input
335 Second control input
340 Output (Err)

The invention claimed is:

1. A control device for controlling a load, wherein the control device comprises the following elements:
   a first current control valve between a first port of the load and a potential of an operating voltage;
   a second current control valve between a second port of the load and a second potential of the operating voltage;
   a processor that is configured to actuate the second current control valve when the first current control valve is closed, in order to control a current through the load;
   a sampling device for determining an input voltage through the first current control valve, wherein the processor is configured to determine the presence of a short circuit between the first port and the first potential, if the input voltage does not increase when the first current control valve is opened gradually; and
   a series resistor in the current flow of the load.

2. The control device according to claim 1, wherein the processor is configured to determine the presence of a short circuit between the first port and the second potential if the input voltage exceeds a predetermined threshold value.

3. The control device according to claim 1, wherein the first potential comprises a high potential, and the second potential comprises a low potential.

4. The control device according to claim 1, wherein the first potential comprises a low potential, and the second potential comprises a high potential.

5. The control device according to claim 1, wherein the first current control valve comprises a field effect transistor, and the gradual opening comprises a decrease in a gate-source voltage.

6. An integrated current control valve for controlling a load, wherein the integrated current control valve comprises:
   a semiconductor switch for controlling a current between a potential of an operating voltage and a port of the load;
   a comparator for comparing a voltage decrease through the semiconductor switch with a predetermined value;
   an activation device for the semiconductor switch, wherein the activation device is configured to gradually alter a control voltage of the conducting semiconductor switch to a non-conducting state, and to generate a warning signal if the comparator does not determine the presence of a sufficient voltage; and a series resistor in the current flow of the load.

7. A method for controlling a load, the method comprising:

providing a load that has two ports, wherein the first port is connected to a first potential of an operating voltage through a first current control valve, and the second port is connected to a second potential of the operating voltage through a second current control valve, and wherein a resistor is in series with the load gradually opening the first current control valve when the second current control valve is actuated; and determining the presence of a short circuit between the first port and the first potential if an input voltage through the first current control valve does not increase.

8. The method according to claim 7, also comprising a step for actuating the second current control valve through periodic opening and closing thereof.

9. The control device according to claim 1, wherein the processor is configured to determine the presence of a short circuit between the second port and the second potential if the input voltage exceeds a predetermined threshold value.

10. The control device according to claim 1, wherein the first current control valve comprises a field effect transistor, and the gradual opening comprises an increase in a gate-source voltage.

11. The control device according to claim 1, wherein the load comprises a load that has an inductive component and an ohmic component.

12. The control device according to claim 1, wherein the load comprises a plurality of individual loads and the second current control valve comprises a plurality of individual second current control valves, wherein each of the plurality of individual loads includes a second port and a dedicated second current control valve between the second port and the operating voltage.

13. The control device according to claim 1, further comprising an inverse-polarity protection between the first potential of the operating voltage and the first current control valve.

14. The control device according to claim 1, further comprising an inverse-polarity protection between the second potential of the operating voltage and the second current control valve.

15. The control device according to claim 1, further comprising a diode connected in parallel to the load and counter to the direction of flow from the first potential of the operating voltage to the second potential of the operating voltage.

16. The control device according to claim 1, wherein the first current control valve is configured to be partially opened immediately before being opened gradually.

17. The integrated current control valve according to claim 6, further comprising an inverse-polarity protection.

18. The method according to claim 7, also comprising a step of initiating the method when a current flowing through the load exceeds a predetermined minimum value.

19. The method according to claim 7, also comprising a step of closing the first current control valve quickly after determining there is no short circuit between the first port and the first potential of the operating voltage.

* * * * *